(12) United States Patent
Fathollahi

(10) Patent No.: US 9,565,913 B2
(45) Date of Patent: *Feb. 14, 2017

(54) ACTIVE SUSPENSION CASE FOR A MOBILE DEVICE

(71) Applicant: INCIPIO, LLC, Irvine, CA (US)

(72) Inventor: Andy Fathollahi, Corona Del Mar, CA (US)

(73) Assignee: Incipio, LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/791,146

(22) Filed: Jul. 2, 2015

(65) Prior Publication Data

US 2015/0351509 A1  Dec. 10, 2015

Related U.S. Application Data

(63) Continuation of application No. 13/910,980, filed on Jun. 5, 2013, now Pat. No. 9,072,353.

(60) Provisional application No. 61/677,432, filed on Jul. 30, 2012, provisional application No. 61/655,952, filed on Jun. 5, 2012.

(51) Int. Cl.
*B65D 25/00* (2006.01)
*A45C 13/00* (2006.01)
*A45F 5/00* (2006.01)
*B65D 81/02* (2006.01)
*H04B 1/3888* (2015.01)
*H05K 5/02* (2006.01)
*A45C 11/00* (2006.01)

(52) U.S. Cl.
CPC ............ *A45C 13/002* (2013.01); *A45C 11/00* (2013.01); *A45F 5/00* (2013.01); *B65D 81/022* (2013.01); *H04B 1/3888* (2013.01); *A45C 2011/002* (2013.01); *A45C 2011/003* (2013.01); *H05K 5/0243* (2013.01)

(58) Field of Classification Search
CPC ......... H05K 5/0243; H04M 1/00; H04M 1/04; B65D 25/00
USPC ....... 206/320; 224/666, 667, 668; 455/575.8
See application file for complete search history.

(56) References Cited

U.S. PATENT DOCUMENTS 7,930,011 B2 * 4/2011 Shi ...................... H05K 5/0243
                                                  206/320

* cited by examiner

*Primary Examiner* — King M Chu
(74) *Attorney, Agent, or Firm* — Manatt, Phelps & Phillips, LLP

(57) ABSTRACT

An improved protective case for a mobile device is disclosed herein. The protective case may comprise a base portion, a stop, and at least one sliding or moving impact section to assist in the absorption of impact.

17 Claims, 11 Drawing Sheets

ACTIVE SUSPENSION CASE FOR A MOBILE DEVICE

CROSS-REFERENCE TO RELATED APPLICATIONS

This application is a continuation of U.S. application Ser. No. 13/910,980, filed Jun. 5, 2013, which claims the benefit of priority to U.S. Provisional Application Nos. 61/655,952, filed Jun. 5, 2012 and 61/677,432, filed Jul. 30, 2012. All of the above applications are hereby incorporated herein by reference in their entirety and are to be considered a part of this specification.

BACKGROUND

Field

This application relates to protective cases for a mobile device.

Description of the Related Art

Mobile devices are often known to be dropped by a user or to fall off of objects such as a table, sometimes resulting in damage to the mobile devices such as a cracked screen, lost button, cracked mobile device body, etc. Thus cases have been provided to protect a mobile device from damage that could be sustained from a fall. Protective cases for mobile devices have been provided that have flexible components in impact areas, such as corners of the case, such as those disclosed in US Patent Application Publication No. 2011/0228459.

However, there still exists a need for desirable alternatives to provide protection to a mobile device in case of a fall.

SUMMARY

An aspect of at least one of the embodiments disclosed herein includes the realization that a protective case may provide beneficial impact resistance and protect a mobile device contained therein through features incorporated into the protective case. For example, a case may comprise a base portion of the case comprising a back panel and at least one side portion extending upward from the back panel, the at least one side portion configured to engage two pairs of opposing sides of a mobile device, at least two channels disposed on the back side of the case, and a stop disposed on the back side of the case, the stop being adjacent to the at least two channels, and one or more impact sections disposed around the stop, located on the back side of the case. The one or more impact sections may detachably connected to the base portion of the case by the at least two channels through a tongue-and-groove-type sliding mechanism or rail system.

Thus, in accordance with one embodiment, a case may comprise a back panel comprising a first interface surface and at least two impact sections, each comprising a second interface surface, wherein the first interface surface and the second interface surface are configured such that the at least two impact sections are movable and, preferably, slidable with respect to the back panel. Desirably, the at least two impact sections are separate pieces from one another. Further, at least a portion of the second interface surface of one of the at least two impact sections may substantially continually contact said first interface surface when the case is not subject to an impact force. In addition, at least a portion of said second interface surface of each of said at the least two impact sections may substantially continually contact at least a portion of said first interface surface when said case is not subject to an impact force.

Thus, in accordance with yet another embodiment, an assembly may comprise a frame, a first impact piece; and a second impact piece separate from the first impact piece. The first impact piece may be slidable with respect to the frame and independently of the second impact piece. The second impact piece may be movable with respect to the frame.

In accordance with yet another embodiment, a method of protecting a mobile device can include providing a case having a base portion comprising a back side and four transverse extending walls, the four transverse walls extending vertically from the back side of the case, at least two channels disposed on the back side of the case forming a tongue-and-groove-type sliding mechanism or rail system, and one or more supporting pieces disposed around a central piece, located on the back side of the case, the one or more supporting pieces are detachably connected to the base portion by the at least two channels through the tongue-and-groove-type sliding mechanism, inserting the mobile device into the case, and reducing the transfer of impact energy to the mobile device through lateral and/or sliding movement of the one or more supporting pieces as compared to the transfer of impact energy to the mobile device if the mobile device were not inserted in the case.

BRIEF DESCRIPTION OF THE DRAWINGS

These and other features and advantages of the present embodiments will become more apparent upon reading the following detailed description and with reference to the accompanying drawings of the embodiments, in which.

DETAILED DESCRIPTION

An improved protective case for a mobile device is disclosed herein. The embodiments disclosed herein are described in the context of a protective case for a cell phone because the embodiments disclosed herein have particular utility in this context. However, the embodiments and inventions herein can also be applied to other types of mobile devices, including, but not limited to tablets, PDAs, e-readers, MP3 players (such as an iPod®), laptops, etc.

The terms "approximately", "about", and "substantially" as used herein represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

Figure 1:
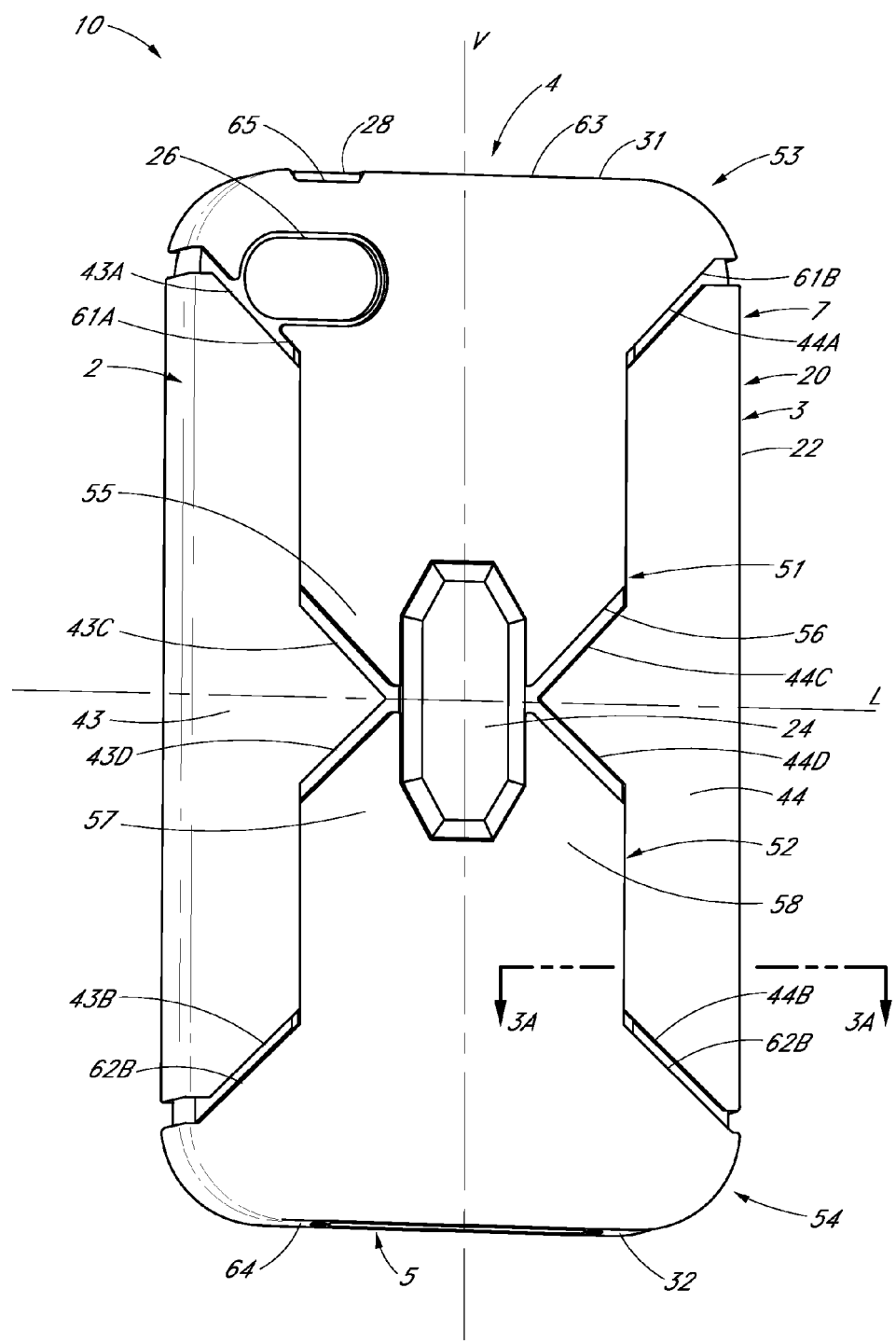
FIG. 1 is a rear plan view of an assembled improved protective case according to one embodiment.
Figure 2:
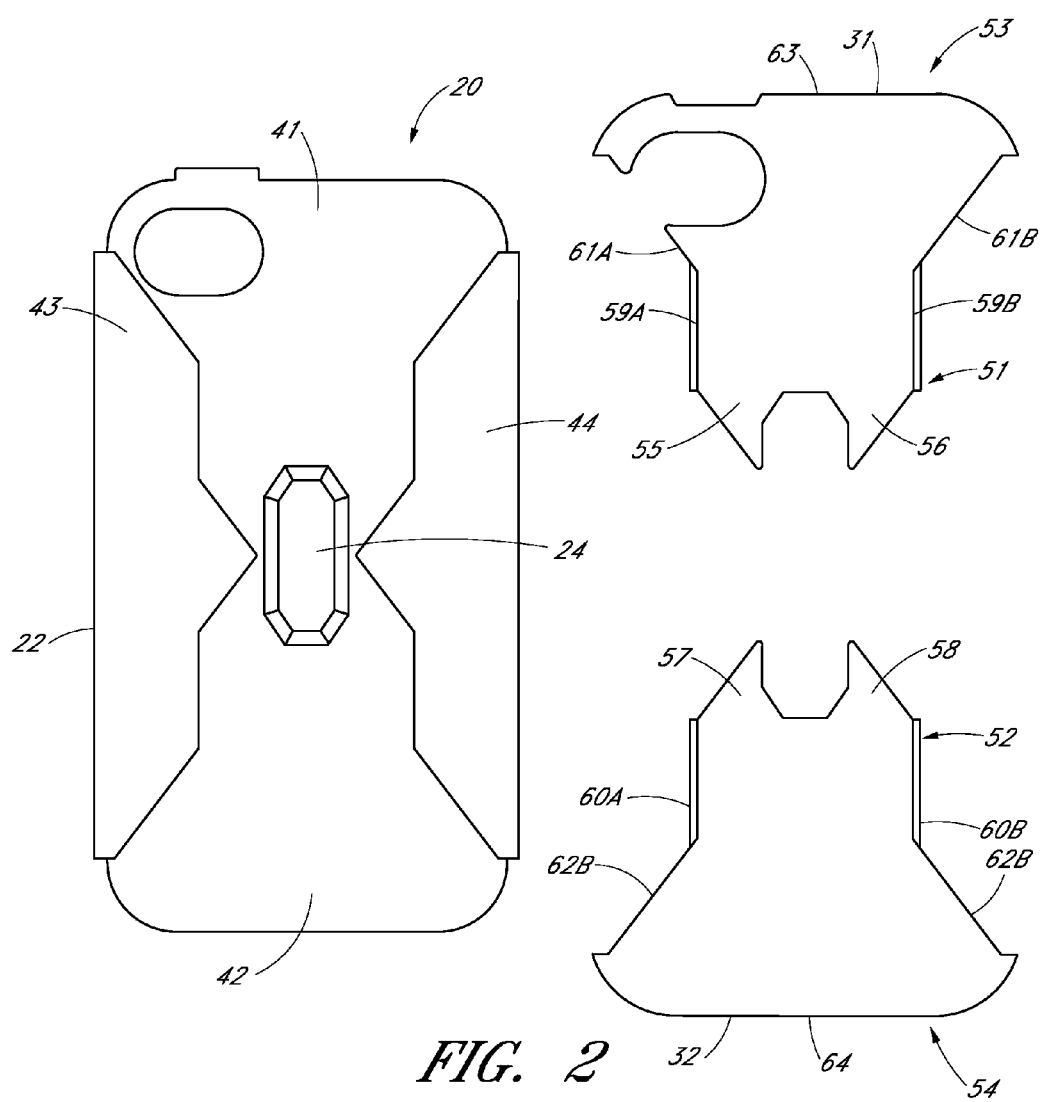
FIG. 2 is a separated rear plan view of the case of FIG. 1.
Figure 3:
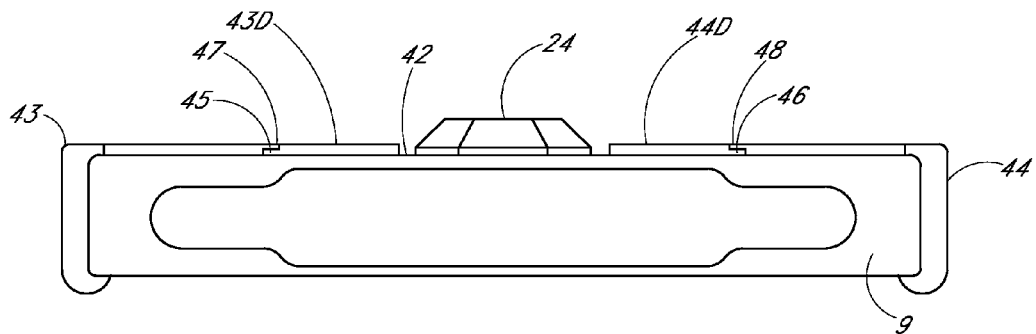
FIG. 3 is a bottom end view of the case of FIG. 1, where the impact sections are removed.

Referring to FIGS. 1-3, the case 10 generally comprises a base portion 20 or frame and one or more impact sections or portions or pieces 31, 32 which are desirably movable relative to the base portion 20. The impact sections 31, 32 can be disposed around a stop 24, which can be located centrally on the back panel 22 of the base portion 20. The case 10 can be generally shaped to contain and protect a mobile device (e.g. an iPhone®). When placed inside of a case, the mobile device (as shown for example, in FIG. 7) desirably fits snugly, although the user still has access to the buttons and/or touch screen of the mobile device either directly through apertures in the case 10 or indirectly through button features included on the base portion 20.

As illustrated in the embodiment of FIGS. 1-4, the case 10 may desirably be generally rectangular in shape to fit the exterior of a mobile device, such as an iPhone 4 or an iPhone 4s. The case may have four corners and a side support that extends around the case. For example, as viewed from the back, with the camera opening at the top, the case illustrated in FIG. 1 may have a left side 2, a right side 3, a top end 4, and a bottom end 5. However, the shape of case 10 as shown in the figures is not limiting, and in some embodiments the case may be shorter, longer, thicker, or thinner than is shown in the embodiments of the figures. In some embodiments the case may be generally circular, oval, square, or any other suitable polygon in shape.

FIG. 1 is a rear plan view of the improved protective case 10 for a mobile device, incorporating certain features, aspects and advantages of the present invention. The case 10 is described herein with reference to a coordinate system wherein a lateral axis L extends from the left side 2 of the of the case 10 to the right side 3 of the case 10. A vertical, central plane generally bisects the case 10 and the lateral axis. A longitudinal axis extends normal to the lateral axis and lies within a horizontal plane. In addition, relative vertical movements of features of the case are generally expressed as distances towards and away from lateral axis L, bisecting the case 10 in the planar position shown in FIG. 1. Linear forces, as described herein, refer to forces exerted upon the case 10 at least partially parallel to or along the longitudinal, lateral, and/or vertical axes. Vertical axis V also bisects the case, and runs normal to lateral axis L from the top end 4 to the bottom end 5. Angles described herein are expressed relative to vertical axis V.

Figure 4:
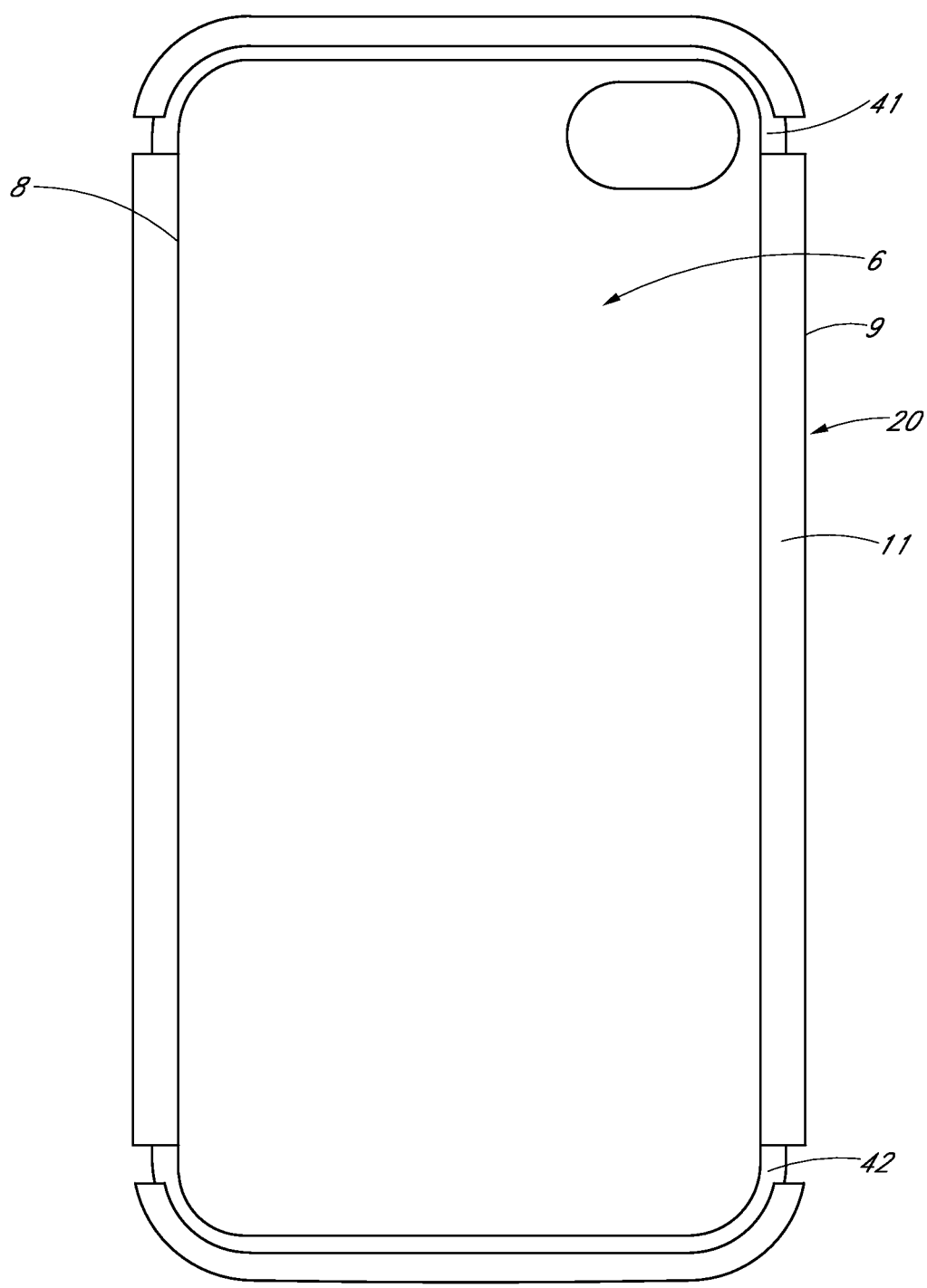
FIG. 4 is a front plan view of the case of FIG. 1.
Figure 5:
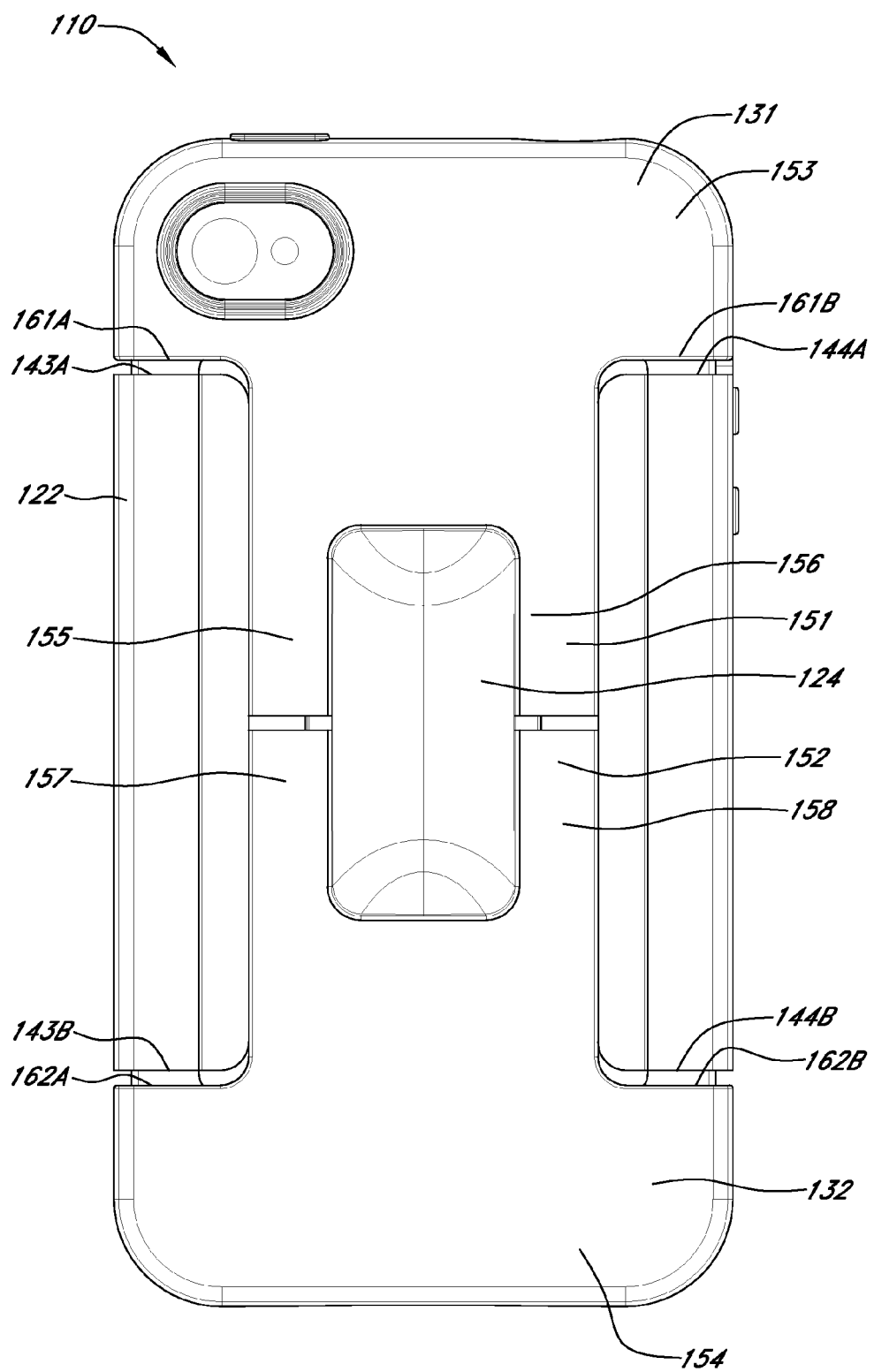
FIG. 5 is a rear plan view of an assembled improved protective case according to another embodiment.

With further reference to the case illustrated in FIG. 4, the base portion or frame 20 may comprise an inner portion 6 defining an interior of the base portion 20 and a rear surface 7 (FIG. 1) defining an exterior of the base portion. The inner portion 6 is desirably generally concave and defines a cavity 8 into which a mobile device may be inserted. When a mobile device is inserted in the cavity 8, the interior generally contacts the back and sides of the mobile device.

In the embodiment of FIGS. 1-4, the rear surface 7 of the base portion 20 comprises a back panel 22 and a side support 9 that extends vertically, or upwardly from the back panel 22 and around the base portion 20, defining a perimeter of the base portion 20. An edge of the side support 9 then may extend inwards a short distance to form the front edge 11 of the base portion 20 and define the cavity 8. When a mobile device is inserted into the base portion 20, the front edge 11 may extend at least partway over the mobile device. The side support 9 may comprise four transverse extending walls. The four transverse extending walls may extend from the back panel 22 of the case. In some embodiments the side support 9 may comprise straight or substantially straight walls that extend vertically from the back panel 22. According to some embodiments, these walls may be curved.

The back panel 22, as shown in FIGS. 1-2, may also include a stop 24, and a feature window 26, shaped to allow a clear view of a feature located on the rear of the mobile device, such as a camera lens. The side support 9 may include feature apertures 25 corresponding to features on the mobile device, for example, the headphone inlet, the vibrate switch, the port inlet, and the volume control (illustrated). In some embodiments, the feature window 26 may include a film or covering disposed on the inner portion 6 or the rear surface 7 to further protect the feature located on the rear of the mobile device from debris and/or assist the functionality of the feature located on the rear of the mobile device, such as a camera lens and/or a flash.

Other feature apertures may be incorporated into the base portion 20 to allow for access to other features present on the mobile device. The base portion 20 may also include button features 28 corresponding to other features on the mobile device such as the sleep or on/off switches (illustrated). The button features 28 may also be formed into the base portion 20 to correspond to other features of the mobile device. The button features 28 may desirably be molded into the base portion 20, as thus made of the same material of the base portion 20. However, in some embodiments the button features 28 may be made of a different material than the base portion 20, or they may comprise an additional material, such as rubber, coated on the button features 28 to improve tactility and use of the button features 28.

The base portion 20 may desirably be made of a polymeric or plastic material. Such materials may include rubber, silicon, thermoplastic polyurethane ("TPU"), cross-linked ethylene propylene diene class rubber polypropylene polymers such as Santoprene® available from ExxonMobil, and/or other suitable thermoplastic or thermoset elastomeric polymers and copolymers. The base portion 20 may be made of a material that is suitably flexible to allow a mobile device to be resiliently received and snugly retained within the base portion 20 and to allow the button features 28 to flex and contact the corresponding buttons on a mobile device without fracture or permanent deformation. Additionally, the base portion 20 materials alone may be impact resistant enough to resist fracture or permanent deformation when the case 10 containing a mobile device is dropped from a user's hand, a table, a desk and similar heights onto a variety of surfaces including concrete, asphalt, carpet, and the like. Such a height may include heights such as six feet, five feet, four feet, three feet, and the like.

According to some embodiments, the base portion 20 material may exhibit a shore A hardness of 95 or about 95 according to ASTM D2240 testing methods. In some embodiments, the shore A hardness of the material comprising the base portion is in the range of between about 80 and about 110.

According to some embodiments, the base portion 20 materials may also exhibit a tensile strength at break of 5700 psi or about 5700 psi according to ASTM D412 testing methods. In some embodiments, the tensile strength at break is in the range of between about 3500 psi and about 8000 psi.

According to some embodiments, the base portion 20 material may exhibit an elongation of 400% or about 400% at break according to ASTM D412 testing methods. In some embodiments, the elongation at break is in the range of between about 200% and about 600%.

As illustrated in the embodiment of FIG. 1, the stop 24 is shown approximately in the center of the back panel 22. The stop 24 may comprise a plastic or polymeric material. The stop 24 may comprise materials such as thermoplastic polyurethane ("TPU"), cross-linked ethylene propylene diene class rubber polypropylene polymers such as Santoprene® available from ExxonMobil, and other suitable thermoplastic or thermoset elastomeric polymers and copolymers. The stop 24 may be provided to absorb impact directly from a fall, but also through compression of the impact sections 31, 32. The stop may be made of a compressible, resilient material, such that, after it is compressed and the compressing force is removed, the stop generally returns to its original shape. The resilient nature of the material may apply equally in all directions of pressure to the stop 24. In other embodiments, the stop 24 may be made of a material that is more resilient when subjected to a linear force than a rotating or torsional force. In yet other embodiments, the stop 24 may be made of a material that is more resilient when subjected to a rotating or torsional force than a linear force.

In some embodiments, the stop 24 may be made from a different material than the base portion 20. For example, the stop 24 may be made of materials that are softer at room temperature than the base portion 20. In some embodiments, the stop 24 may be made of a material that has a lower Tg than the base portion 20. In some embodiments, the stop 24 may be made of a more resilient material than the base portion 20.

In some embodiments, the stop 24 thus may exhibit a shore A hardness of 50 or about 50 according to ISO 868 testing methods. In some embodiments, the shore A hardness of the material comprising the base portion is in the range of between about 30 and about 70.

In some embodiments, the stop 24 may also exhibit a tensile strength at break of 600 psi or about 600 psi according to ASTM D412 testing methods. In some embodiments, the tensile strength at break is in the range of between about 350 psi and about 1000 psi.

In some embodiments, the stop 24 may exhibit an elongation at break of 400% or about 400% according to ASDM D412 testing methods. In some embodiments, the elongation at break is in the range of between about 150% and about 600%.

The embodiment illustrated in FIGS. 1-4 has a stop 24 in the shape of an 8-sided prism. However, the stop 24 may be made in a variety of shapes, e.g. circular, rectangular, square, semi-hemispherical, etc and still enjoy certain advantages.

The stop 24 may be separate or integrally formed with the base portion 20. While the illustrated embodiment in FIGS. 1-4 has the stop 24 located roughly in the center of the back panel 22 of the base portion 20, in other embodiments the stop may be located on any portion of the back panel 22 of the base portion 20, e.g. near the top, bottom, left hand side, right hand side, or in another location.

As best illustrated in FIG. 2, the back panel 22 also may include indents 41, 42 proximate the stop 24 and configured to generally correspond to the shape of the impact sections 31, 32. The indents 41, 42 may extend from the back panel 22, around the side support 9 over the top and/or bottom of the base portion 20, and may form at least a portion of the front edge 11. Raised portions 43, 44 correspond with the indents 41, 42 and may extend from the back panel 22 around the side support 9, and form at least a portion of the front edge 11. An interface between the indents 41, 42 and the raised portions 43, 44 may comprise a difference in height between the indents 41, 42 and the raised portions 43, 44 of desirably about 2.0 mm. According to some embodiments, the difference in height may be 0.2 mm, 0.5 mm, 1.0 mm, 3.0 mm, 5.0 mm, and the like.

Figure 3A:
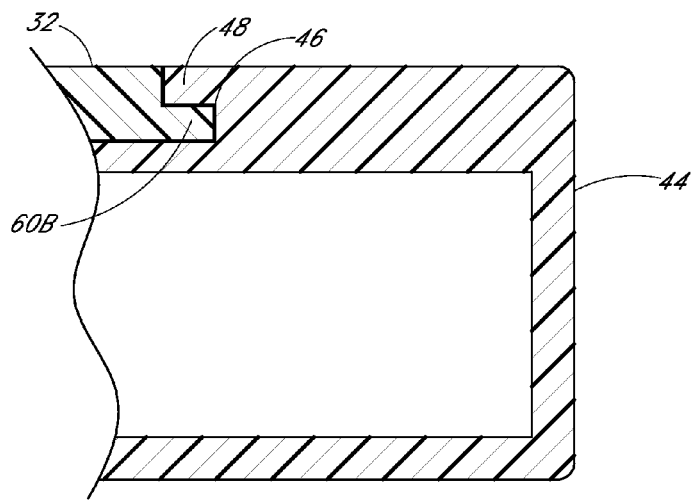
FIG. 3A is a portion of an enlarged cross-sectional view of the case along 3A-3A of FIG. 1.

As illustrated in FIGS. 3 and 3A, at least two channels 45, 46 may be disposed in one or more portions of the interface between the indents 41, 42 and the raised portions 43, 44. Desirably, the channels 45, 46 may be located near the stop 24. The channels 45, 46 may be defined by an extending projection 47, 48 of a part of a raised portion 43, 44 over a portion of the indent 41, 42.

Figure 3B:
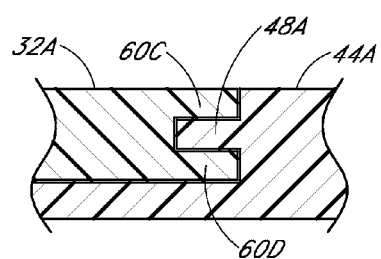
FIG. 3B is a portion of an enlarged cross-sectional view of an alternative embodiment of the case, similar to FIG. 3A.

An alternative embodiment is illustrated in FIG. 3B. According to this embodiment, a raised portion 44A may include an intermediate extending flange or projection 48A. An impact section 32A may include two extending flanges 60C, 60D configured to extend around the intermediate extending projection 48A of the raised portion 44A to form a rail system. The other impact section may incorporate the same construction.

As discussed above, the case 10 desirably comprises one or more impact sections 31, 32. The impact sections 31, 32 may be separable or detachable from the base portion 20, as shown in FIG. 2. Each of the impact sections 31, 32 may comprise a relatively flat back panel that comprises a proximal portion 51, 52 and a distal portion 53, 54. The proximal portion 51, 52 desirably defines a stop interface portion which may comprise two arms 55, 56, 57, 58 that are shaped to partially surround the stop 24 when the impact section 31, 32 is attached to the case 10. When the case 10 is assembled, as shown in FIG. 1, the impact sections 31, 32 may directly contact the stop 24. Each proximal portion 51, 52 may also desirably define a guide portion which may include at least two laterally extending flanges 59A, 59B, 60A, 60B disposed on the left and right sides of the proximal section 51, 52, respectively. The distal portion 53, 54 may also comprise a rotational stop portion which may comprise diagonally extending edges 61A, 61B, 62A, 62B. The diagonally extending edges of the distal portion of the impact section or sections may extend to an end of the impact section which comprises a vertically extending wall, forming a side support 63, 64 of each impact section 31, 32. When connected to the base portion 20, the two impact sections 31, 32 may move and operate independently of one another, when one or both of the impact sections 31, 32 are subject to an impact force.

In the embodiment shown in FIG. 3A, the faces of the raised portions 43, 44 directed toward the impact section 31 and the faces of the raised portions 43, 44 directed toward the impact section 32 define a first interface surface. The faces of the impact section 31 facing the raised portions 43, 44 and the faces of the impact section 32 facing the raised portions 43, 44 define a second interface surface. Thus, as seen in FIG. 3A, the first interface surface includes a first vertical surface defined by the flange 48 and the vertical surface extending from the flange 48 to the floor of the indent 41. A first horizontal retention surface is defined by the horizontal surface defined by the flange 48 which faces the flange 60B of the impact section. Similarly, the second interface surface includes a first vertical surface defined by the flange 60B, the horizontal surface defined by the flange 60B and the vertical surface extending from the flange 60B and the rear surface 7 of the base portion 20. A second horizontal retention surface is defined by the horizontal surface defined by the flange 60B which faces the flange 48 of the raised portion 44. When the case is assembled, at least a portion of the first interface surface desirably continually, or substantially continually contacts at least a portion of the second interface surface.

In the embodiment shown in FIG. 3B, the faces of the raised portions 43A, 44A directed toward the impact section 31A and the faces of the raised portions 43A, 44A directed toward the impact section 32A define a first interface surface. The faces of the impact section 31A facing the raised portions 43A, 44A and the faces of the impact section 32A facing the raised portions 43A, 44A define a second interface surface. Thus, as seen in FIG. 3B, the first interface surface includes a first vertical surface defined by the flange 48A, the vertical surface extending from the flange 48A to the floor of the indent 41A and the vertical surface extending from the flange 48A to the rear surface 7A of the base portion 20A. A pair of first horizontal retention surfaces are defined by the horizontal surfaces defined by the flange 48A which face the flanges 60C, 60D of the impact section. Similarly, the second interface surface includes a vertical surface defined by the flange 60C, a vertical surface defined by flange 60D and a vertical surface extending between flanges 60C and 60D. A pair of second horizontal retention surfaces are defined by the horizontal surfaces defined by the flanges 60C, 60D which face the flange 48A of the raised portion 44A. When the case is assembled, at least a portion of the first interface surface desirably continually, or substantially continually contacts at least a portion of the second interface surface.

The case 10 shown in FIGS. 1-4 only has two impact sections. However, in other embodiments the case 10 may comprise one, three, four, or five impact sections and the like. The impact sections may have similar properties as impact sections disclosed elsewhere in this application.

The side support 63, 64 of each impact section 31, 32 may include feature apertures 65 that may correspond to matching feature apertures 28 on the base portion 20 as well to features on the mobile device such as a camera lens, on/off switch, headphone inlet, silence vibrate switch, and the like.

The impact sections 31, 32 may be made of a polymeric or plastic material. Such materials may include polycarbonate, polypropylene, polyethylene or any other suitable thermoplastic or thermoset polymeric material. The impact sections 31, 32 may be made of a material that is suitably flexible to attach to the base portion 20 without fracture. Additionally, the material may be impact resistant enough to resist fracture when the case 10 containing a mobile device is dropped from a user's hand, a table, a desk and similar heights onto a variety of surfaces including concrete, asphalt, carpet, and the like. Such a height may include heights such as six feet, five feet, four feet, three feet, and the like.

According to some embodiments, the impact sections 31, 32 may exhibit an impact strength of at least 7.0 ft lbs/in or at least about 7.0 ft lbs/in according to ASTM D256 notched izod testing methods at 73° F. In some embodiments, the impact sections 31, 32 may exhibit impact strength of at least 14 ft lbs/in or at least about 14 ft lbs/in. In some embodiments, the impact strength is in the range of between about 7.0 ft lbs/in and 20 ft lbs/in, between about 14 ft lbs/in about 20 ft lbs/in, between about 10 ft lbs/in and about 14 ft lbs/in, and the like.

According to some embodiments, the impact sections 31, 32 may also exhibit a tensile stress at break of 8700 psi or about 8700 psi according to ASTM D638 testing methods. In some embodiments, the tensile strength at break is in the range of between about 5000 psi and about 10,000 psi.

According to some embodiments, the impact sections 31, 32 may exhibit an elongation of 100% or about 100% at break according to ASTM D638 testing methods. In some embodiments, the elongation at break is in the range of between about 50% and about 300%. In other embodiments, the elongation at break is in the range of between about 50% and about 150%.

The impact sections 31, 32 may be removably attached or detachably connected to the base portion 20 by a tongue-and-grove type sliding mechanism. In order to attach the impact sections 31, 32 to the base portion 20, a user may align one or more flanges 59A, 59B, 60A, 60B to the corresponding channel or channels 45, 46, and slide the impact section or sections 31, 32 into place towards the stop 24 and into place. Once the impact sections 31, 32 are in place, friction between the flanges (e.g. 60A, 60B) and the channels 45, 46 is desirably sufficient to keep the impact sections from sliding off the base portion 20. FIG. 3A illustrates a portion of an impact section 32 secured in the channel 46. The extending projection 48 extends over flange 60B to secure the impact section 32 in place.

In another embodiment, as illustrated in FIG. 3B, a user may attach an impact section 32A to the base portion 44A using the rail-type mechanism by aligning the extending flanges 60C, 60D of an impact section 32A on either side of intermediate extending projection 48A and sliding the impact section 32A into place on the base portion 44A.

As in shown in FIG. 1, the side support 63 of the impact section 31 may extend above or below the side support 9 of the base portion 20. Desirably, each impact section extends above or below the side support 9 of the base portion 20 a distance of 4 mm or less (or about 4 mm or less). According to other embodiments, the impact section extends above or below the side support 9 of the base portion 20 a distance of 3 mm or more (or about 3 mm or more), 2 mm or more (or about 2 mm or more), 1 mm or more (or about 1 mm or more), 0.5 mm or more and the like. According to yet other embodiments, the impact section extends above or below the side support 9 of the base portion 20 a distance between about 0.5 mm and about 1.0 mm.

Also as shown in the embodiment of FIG. 1, the diagonally extending edges 61A, 61B, 62A, 62B of the impact sections 31, 32 are spaced apart from corresponding diagonally extending edges 43A, 44A, 43B, 44B of the raised edges 43, 44. Desirably the diagonally extending edges 61A, 61B, 62A, 62B are spaced a distance in the range of 0.5 mm to 5.0 mm (or about 0.5 mm to about 5.0 mm) from diagonally extending edges 43A, 44A, 43B, 44B, respectively. According to other embodiments, the diagonally extending edges are spaced a distance of 0.5 mm to 4.0 mm (or about 0.5 mm to about 4.0 mm), 0.5 mm to 2.0 mm (or about 0.5 mm to about 2.0 mm), 0.5 mm to 1.0 mm (or about 0.5 mm to about 1.0 mm), and the like, from diagonally extending edges 43A, 44A, 43B, 44B, respectively. When subject to an impact force, a single impact section may rotate a distance from about 0 mm to the distance the diagonally extending edges are spaced apart from one another. In some embodiments, the diagonally extending edges 61A, 61B, 62A, 62B of the impact sections 31, 32 are about uniformly spaced from diagonally extending edges 43A, 44A, 43B, 44B of the raised edges 43, 44 by the distances recited above. According to other embodiments, the distance between the diagonally extending edges 61A, 61B, 62A, 62B of the impact sections 31, 32 and the diagonally extending edges 43A, 44A, 43B, 44B of the raised edges 43, 44 increases along the length of the diagonally extending edges of the impact sections in the ranges recited above.

According to yet other embodiments, the distance between the diagonally extending edges of the impact sections and the diagonally extending edges of the raised edges decreases along the length of the diagonally extending edges of the impact sections in the ranges recited above.

The improved case 10 may also have a hard stop located at 43C, 43D, 44C, 44D. The hard stop 43C, 43D, 44C, 44D is a diagonal edge extending from the raised edges 43, 44 proximate the stop 24. The hard stop 43C, 43D, 44C, 44D prevents the impact sections 31, 32 from sliding down the channels 45, 46 and compressing the stop 24 any distance further than where arms 55, 56 contact hard stop 43C, 44C or where arms 57, 58 contact hard stop 43D, 44D.

The improved case 10 as described above is designed to advantageously absorb force when subject to an impact force such as a fall. The improved case 10 may absorb force from at least one of several mechanisms, and thus prevent a mobile device being contained within the case 10 from cracking, scratching, or fracture of the screen, body, keypad, keyboard, switches, buttons, or any other portion of the mobile device.

According to one embodiment, the improved case 10 may assist in absorbing energy from an impact force through the sliding of the impact section or sections along the channels. For example, when the case is dropped or hit on a surface, resulting in a straight or semi-straight upward or downward force along the vertical axis V upon the impact section or sections, the impact section or sections may slide along the channels, dissipating energy through at least friction between the impact section or sections and the channels. When a sufficient force is applied to the impact section or sections, one or both impact section or sections may contact and compress the stop 24. The compression of the stop 24 dissipates additional energy. As mentioned previously, the stop 24 may be resilient and return to approximately or substantially its original shape, even after being compressed by the impact section or sections. The impact sections may slide along the channels independently of one another.

According to some embodiments, a single impact section connected to the base portion 20 by the tongue-and-groove mechanism can slide and compress the stop 24, when subject to an impact force or other type of force a distance of 5 mm (or about 5 mm) or more toward or away from axis L. According to other embodiments, a single impact section can slide and compress the stop, when subject to an impact force or other type of force a distance of 4 mm (or about 4 mm) or more, 3 mm (or about 3 mm) or more, 2 mm (or about 2 mm), 1 mm (or about 1 mm) or more, 0.5 mm (or about 0.5 mm) or more, and the like.

According to some embodiments, a single impact section connected to the base portion 20 by the tongue-and-groove or rail mechanism can slide along the channel or channels, when subject to an impact force or other type of force a distance of 5 mm (or about 5 mm) or more toward or away from lateral axis L. According to other embodiments, a single impact section can slide along the channel or channels, when subject to an impact force or other type of force a distance of 4 mm (or about 4 mm) or more, 3 mm (or about 3 mm) or more, 2 mm (or about 2 mm) or more, and the like. In some embodiments, a single impact section may slide along the channel or channels, when subject to a force a distance of between about 0 mm and about 25 mm, between about 1 mm and about 20 mm, between about 0 mm and about 10 mm, between about 0 mm and about 5 mm, between about 0.5 mm and about 7 mm and the like.

According to another embodiment the improved case 10 may assist in absorbing energy from an impact force through the rotational and/or torsional movement of the impact section or sections when they are subject to a shearing or sideways force along the lateral axis L. For example, when the case is dropped or hit on a surface, resulting in a sideways or somewhat sideways force being applied to one or more of the impact sections, the impact sections may rotate within the indents, contact the stop 24, and dissipate energy. When a sufficient force is applied to the impact section or sections, one or both impact section or sections may contact and compress the stop 24. The compression of the stop 24 dissipates additional energy. As mentioned previously, the stop 24 may be resilient and return to approximately its original shape, even after being compressed by the rotation of the impact section or sections. The impact sections 31, 32 may rotate independently of one another.

According to some embodiments, a single impact section can rotate up to a maximum angle of 10 degrees (or about 10 degrees) or less relative to vertical axis V between the raised portions 43, 44 and within the indent 141, 142 when subject to a torsional force According to other embodiments, a single impact section can rotate a maximum angle of 5 degrees (or about 5 degrees) or less, 3 degrees (or about 3 degrees) or less, 1 degree (or about 1 degree) or less, and the like. According to an embodiment, a single impact section may be rotatable in the range of between about 3 degrees and about 15 degrees, between about 5 degrees and 10 degrees, between about 5 degrees and 45 degrees, between about 15 degrees and about 30 degrees, and the like.

Figure 6:
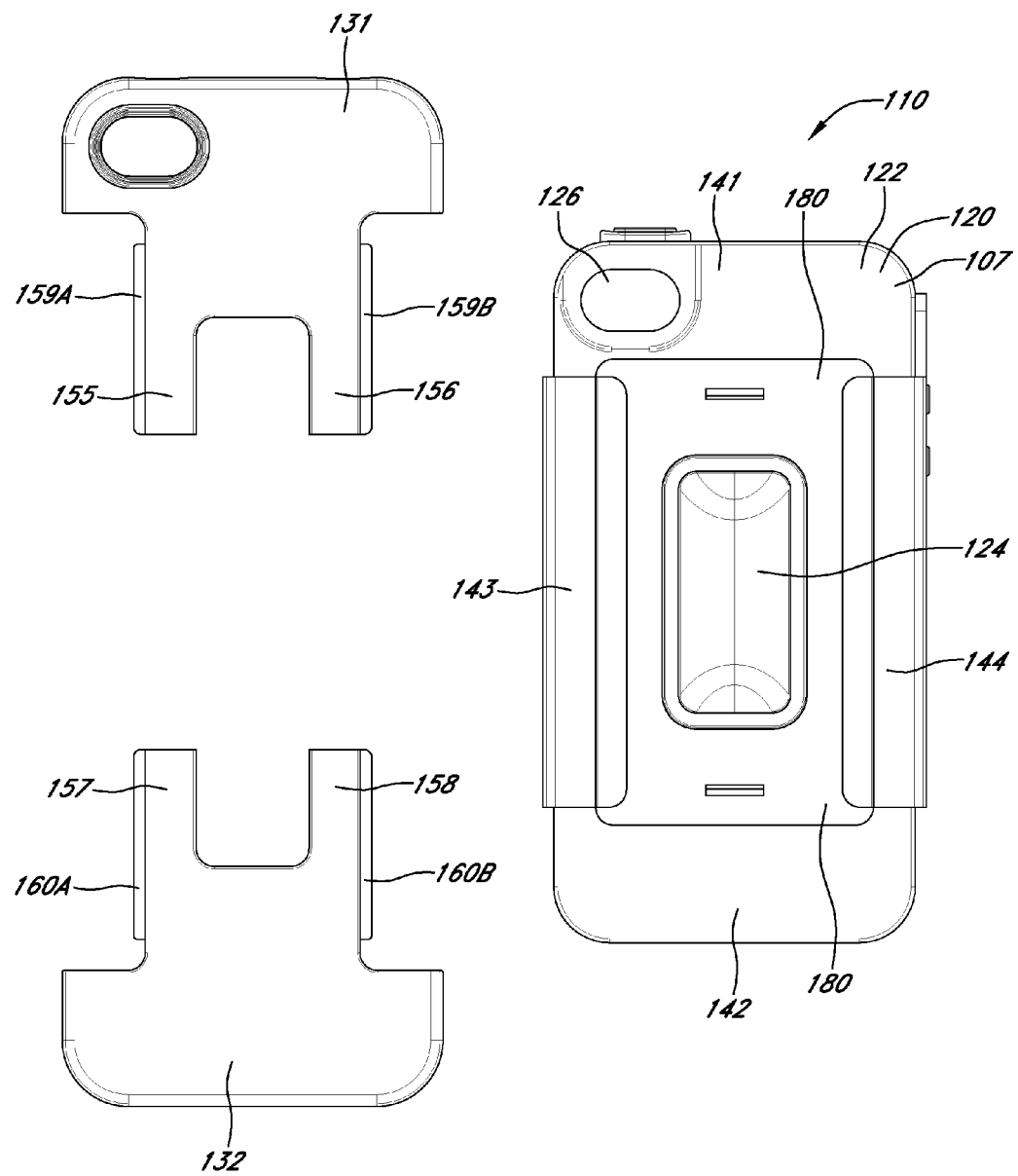
FIG. 6 is a separated rear plan view of the case of FIG. 5.
Figure 10:
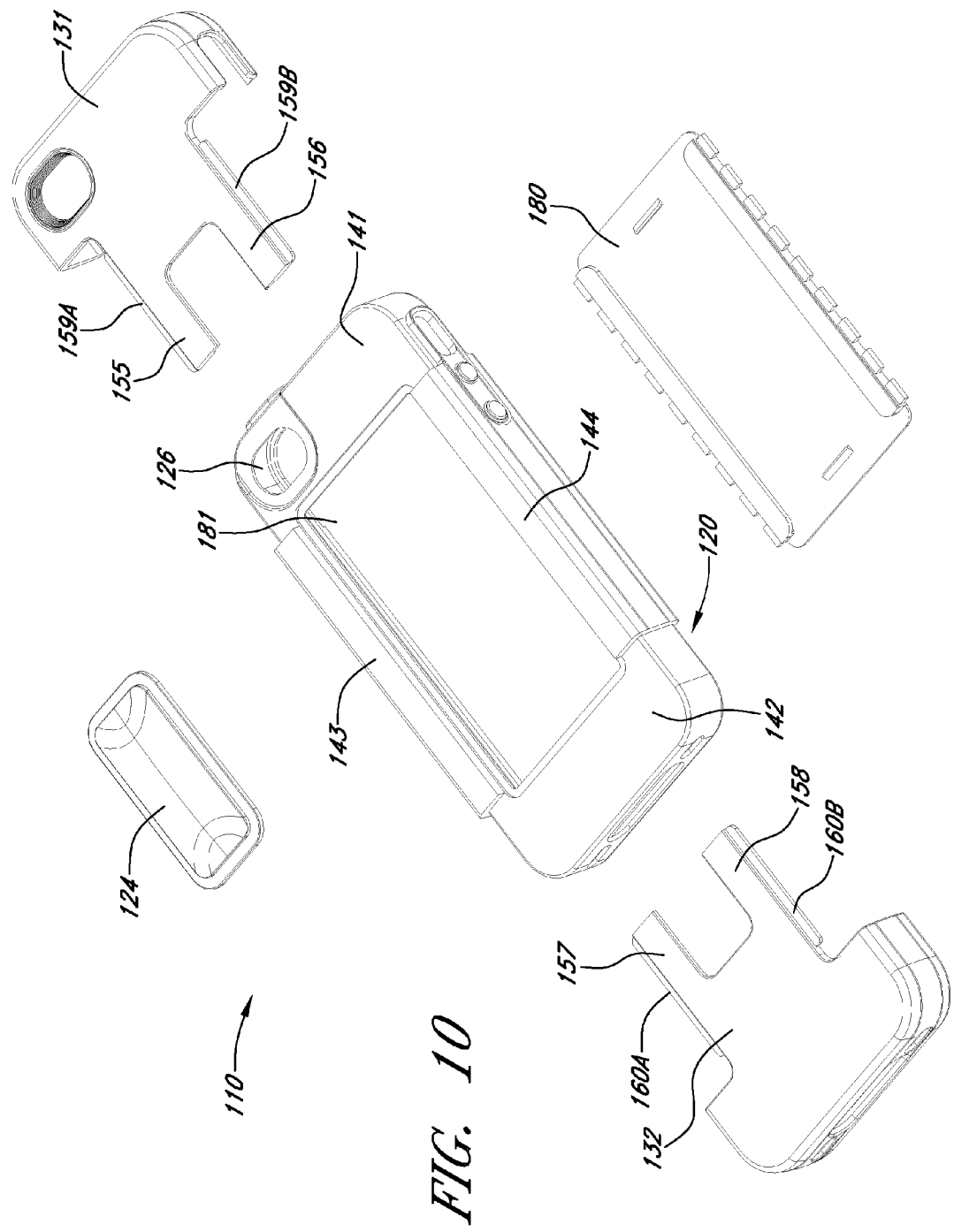
FIG. 10 is a separated rear perspective view of the case of FIG. 5.

According to another embodiment, illustrated in FIGS. 5-11, a case 110 may generally comprise a base portion 120, impact sections or portions or pieces 131, 132, at least one stop 124, and a central portion 180. As illustrated in the embodiment of FIGS. 6 and 10, these components may be separable from one another.

The base portion 120 may comprise an interior 106 and an exterior 107. The exterior may comprise a relatively flat back panel 122. The back panel 122 may include an aperture 181 sized to contain an impact block 180. The impact block 180 may then contain an impact block aperture sized to contain a stop 124. The back panel 122 may also comprise indents 141, 142, generally shaped to contain the impact portions 131, 132 as well as the impact block 180. The back panel 122 may also comprise raised portions 143, 144 configured to contain the impact portions 131, 132 as well as the impact block 180. The impact block 180 may be disposed in the center of the back panel 122.

Impact block 180 thus may exhibit an izod impact resistance of 7.7 ft lbs/in or about 7.7 ft lbs/in at 73° F. In some embodiments, the impact resistance is in the range of between about 1.5 ft lbs/in and about 20 ft lbs/in.

Impact block 180 may also exhibit a tensile strength of 500 psi or about 500 psi. In some embodiments, the tensile strength is in the range of between about 350 psi and about 700 psi.

Impact block 180 may exhibit an elongation of 400% or about 400%. In some embodiments, the elongation is in the range of between about 150% and about 500%.

Impact portions 131, 132 may be separably connected to the top and the bottom of the base portion 120 by channels 145, 146 formed in the impact block 180. The impact portions 131, 132 may be disposed around a stop 124 preferably located in the center of the back panel 122 of the base portion 120. The base portion 120 may comprise indents 141, 142 approximately sized to contain the impact portions 131, 132.

The base portion 120, impact portions 131, 132, and stop 124 may exhibit physical characteristics (such as tensile strength, impact resistance, and the like) similar to those corresponding aspects of the invention described in other embodiments described herein.

The impact sections 131, 132 may be separable from the base portion 120, as shown in FIG. 6. The impact sections 131, 132 may comprise a relatively flat back panel that comprises a proximal portion 151, 152 and a distal portion 153, 154. The impact portions 151, 152 may comprise rectangular arms 155, 156, 157, 158 located proximally to the stop 124. According to some embodiments, when assembled, the rectangular arms 155, 156, 157, 158 may abut or directly contact the stop 124. The impact portions 131, 132 are generally flat, similarly to the back panel 122, then extend downwards to form a side support 163, 164 of the impact portions 131, 132.

As illustrated in FIGS. 6 and 10, the rectangular arms 155, 156, 157, 158 may also include laterally extending flanges 159A, 159B, 160A, 160B disposed on the outward side of each rectangular arm.

Figure 11:
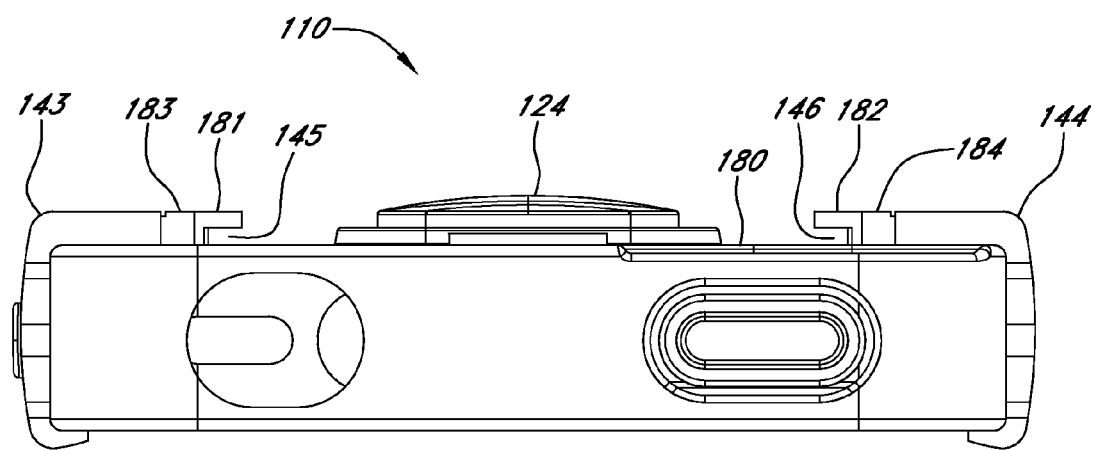
FIG. 11 is a bottom end view of the case of FIG. 5, where the impact sections have been removed.

As illustrated in the embodiment of FIG. 11, at least two channels 145, 146 may be disposed in one or more portions of the impact block 180. The channels may be located near the stop 124. The channels 145, 146 may be defined by an extending edge 181, 182 of a part of a raised portion 183, 184 of the impact block 180.

The impact portions 131, 132 may be connected to the base portion 120 through the channels 145, 146. For example, a user may take an impact portion 132 and align the laterally extending flanges (e.g. 160A and 160B) with the channels 145, 146 and slide the impact portion 132 into place. This forms the tongue-and-groove type mechanism for this embodiment. Once in place, the impact portions 131, 132 may slide up and down the channels independently of one another. However, friction between the flanges and the channels generally keeps the impact portions in place during use.

The improved case may also have a hard stop 143A, 143B, 144A, 144B. The hard stop 143A, 143B, 144A, 144B may be a horizontal edge extending from the raised edges 143, 144 proximate horizontally extending edges 161A, 161B, 162A, 162B of the distal portions 153, 154 of the impact portions 131, 132. The hard stop 143A, 143B, 144A, 144B prevents the impact portions 131, 132 from sliding down the channels 145, 146 and compressing the stop 124 any distance further than where horizontally extending edges 161A, 161B contact hard stop 143A, 144A or where horizontally extending edges 162A, 162B contact hard stop 143A, 144B.

Figure 7:
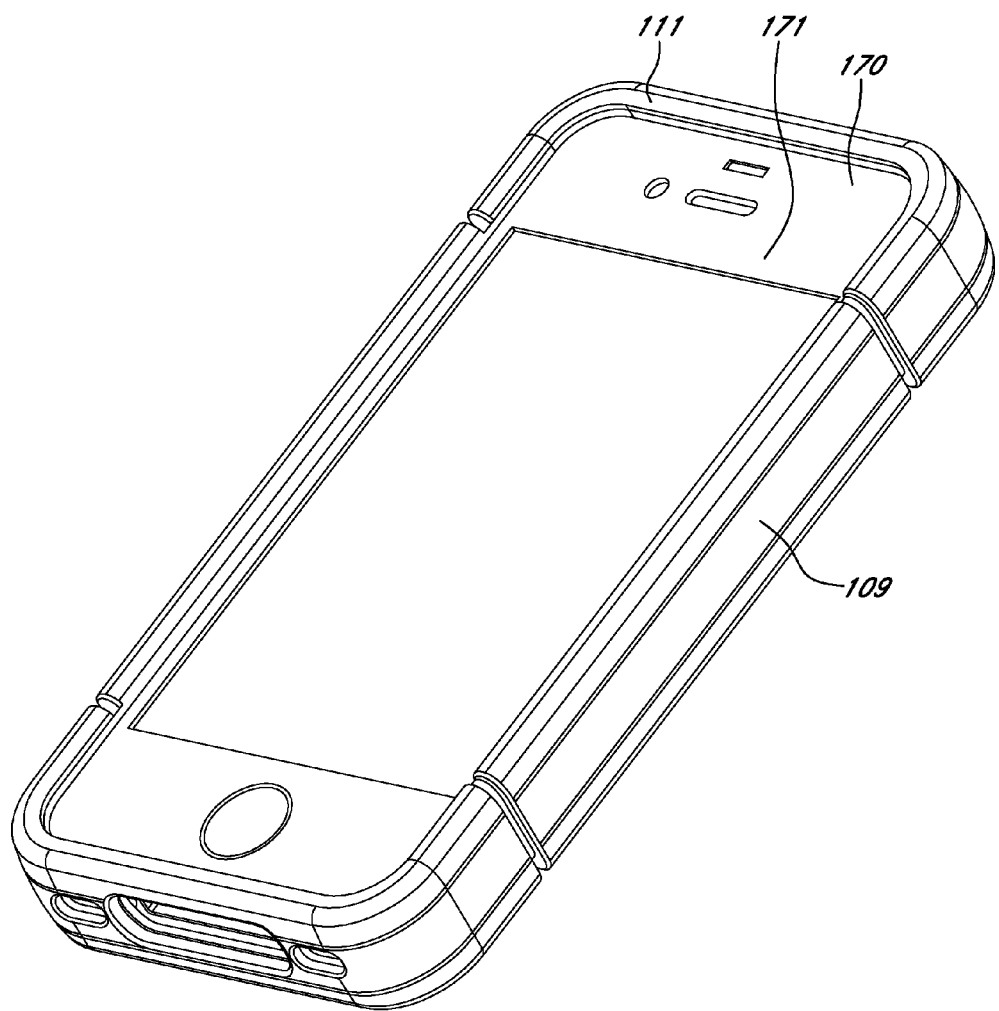
FIG. 7 is a front perspective view of the case of FIG. 5, containing a mobile device.
Figure 8:
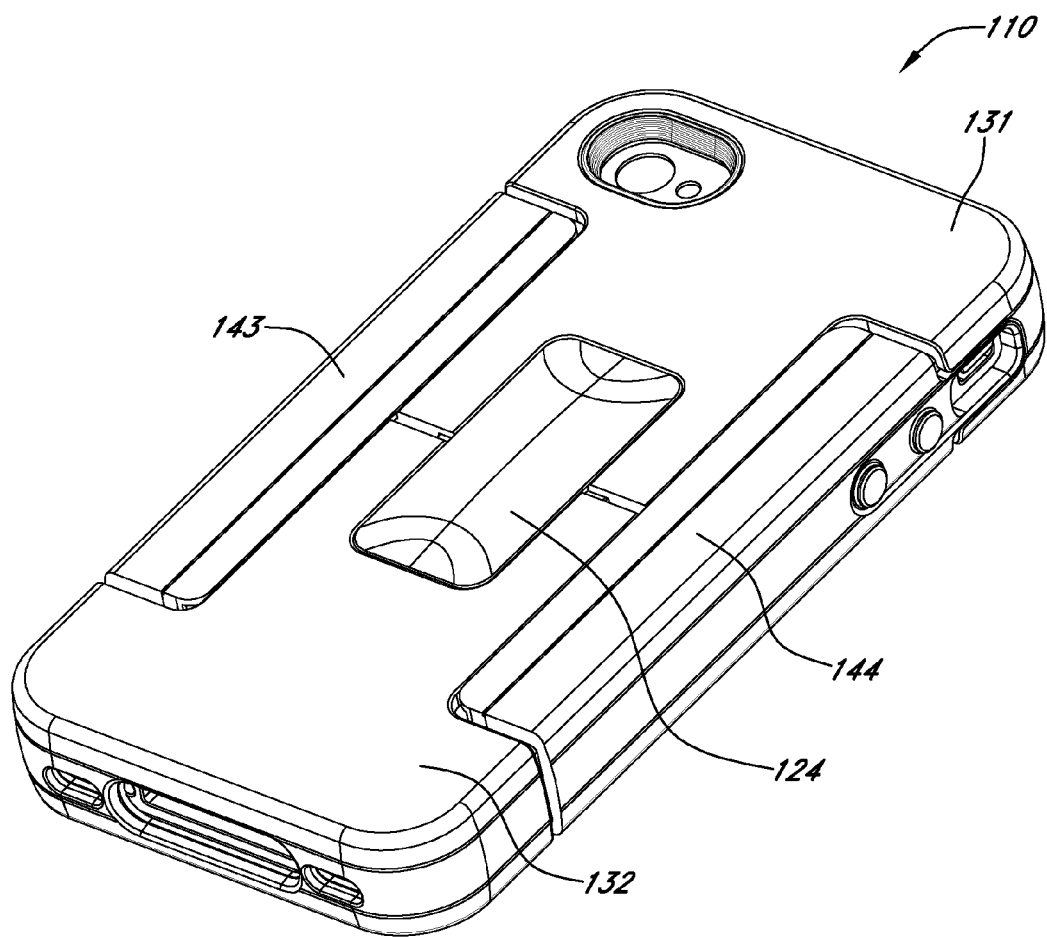
FIG. 8 is a rear perspective view of the case of FIG. 5, containing a mobile device.
Figure 9:
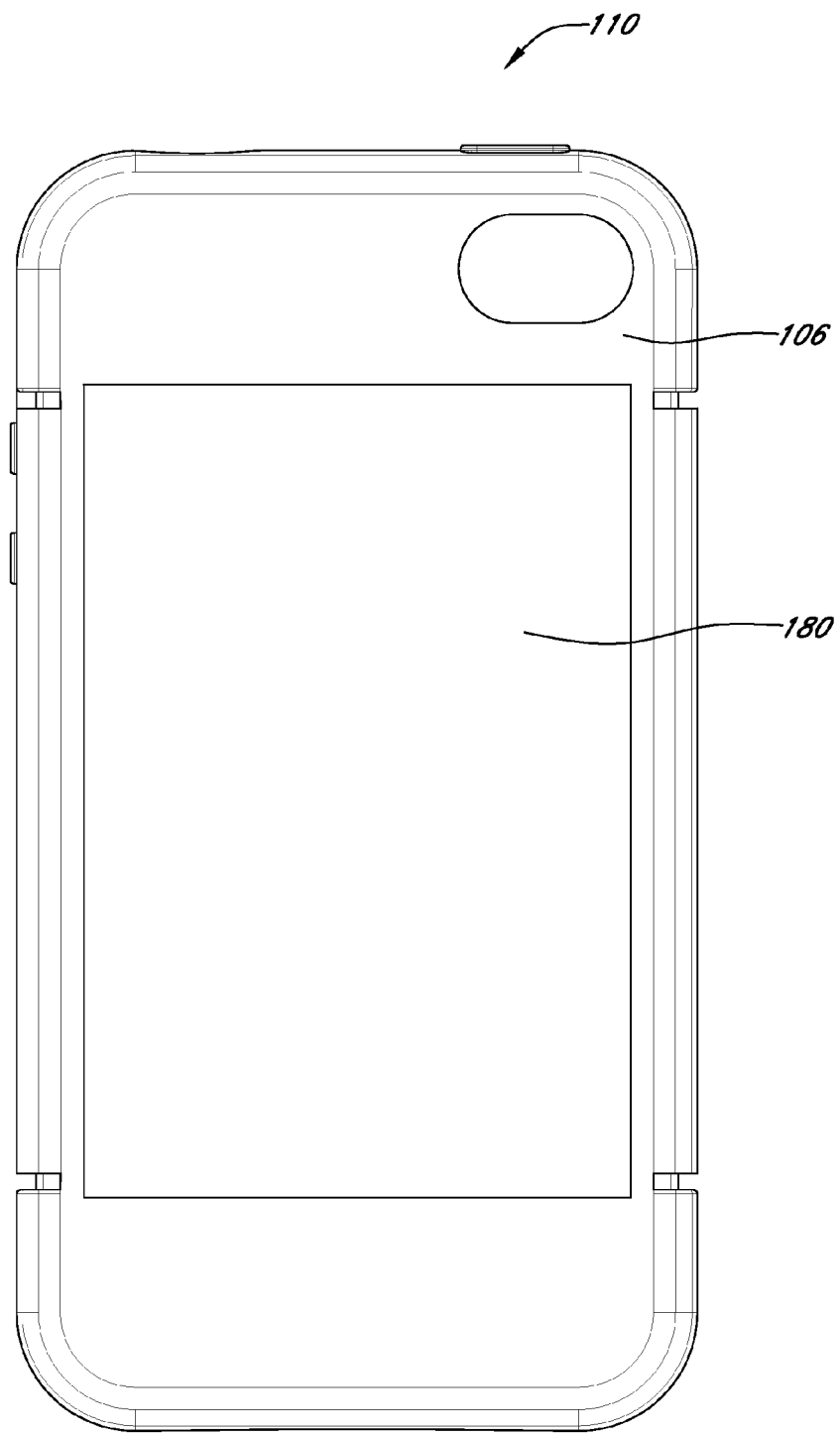
FIG. 9 is a front plan view of the case of FIG. 5.

As illustrated in FIG. 7, a mobile device 170 may be inserted into the protective case 110. The mobile device 170 may have a front 171, a back, a top side, a bottom side, a left side and a right side. When placed inside of the case 110, the mobile device 170 is surrounded on its sides by the side support 109, surrounded on its back by the inner portion 106 (FIG. 9), and the front of the case is partially covered by the front edge 111.

According to other embodiments, impact portions, such as those described above, may be connected to the base portion by a variety of other mechanisms, and thus movable with respect to the base portion.

A method for protecting a mobile device may be achieved through utilization of the protective case described herein. A mobile device may be first inserted into the base portion of the case. Then a user may slide the impact sections into place on the base portion around the stop. When a mobile device is inserted into the case, the case protects the mobile device by reducing the transfer of impact energy to the mobile device through the lateral, rotational, and/or sliding movement of one or more of the impact sections when the case containing the mobile device is subject to a force, including an impact force, as compared to the transfer of energy to the mobile device if the mobile device were not inserted in the case. It is contemplated that in one aspect of operation, the impact sections 31, 32 are configured to slide relative to the back panel along one or more channels or rails disposed therein toward and/or away from the compressible/resilient stop component 24. Sufficient impact force resulting from a fall or the like pushes the impact section receiving the force towards the stop 24, which in turn is compressed (from a first state to a second state) to absorb the communicated force and thereby cushion the impact. Once the force is dissipated, the stop 24 expands to its original state thereby moving the impact section away from the stop 24 to or towards its pre-impacted position so that it the impact section is repositioned or reconfigured to receive another impact. The stop 24 may therefore be formed of a suitably compressible and elastic material to facilitate this functionality and the base portion may be formed as a unitary component separate from the impact sections. In their un-impacted state the impact sections are spaced apart at their opposing or proximate ends to allow for their relative movement vis-à-vis one another and may preferably extend along multiple sides of the case so that in a preferred configuration there is an impact section configured and positioned to receive impact from forces received on any of the sides of the case, preferably on all four corners of the case.

According to some embodiments, the impact sections may be activated mechanically by sensing a fall to extend outward and protect the mobile device contained within the case. A variety of implementations may be employed to activate the impact sections to extend outward when a fall is sensed. For example, the case may include an automatic expansion mechanism to extend the impact sections outwardly. The automatic expansion mechanism can be controlled by a wired or wireless signal (or signals) transmitted or triggered from one or more embedded accelerometers in the mobile device and/or case. The outputs of the one or more accelerometers may be received, monitored, polled and/or processed by a processor or electrical circuit embedded in the mobile device to determine whether a potentially damaging motion (e.g., falling) may have occurred. For example, the acceleration of gravity is 9.8 m/s$^2$ (1 G). When an acceleration value in any direction of the mobile device increases from zero (0) or a low acceleration (e.g., <2 m/s$^2$) to 1 G (or near 1 G) in a relatively short period of time (e.g., 0.25 seconds), it can be considered that a potentially damaging motion has occurred. The relative triggering motion may be measured in different ways and triggered at desired, selected or selectable points or ranges. Sensing rotation, for example via the output(s) of an orientation sensor can also (with or without an accelerometer) be used to determine potentially damaging motions and/or potential impact axis. Once a potentially damaging motion is determined, the mobile device and/or case may transmit an output or one or more signals to trigger the automatic expansion mechanism. The mobile device and/or case (e.g., battery powered case) can be electrically and/or magnetically coupled to provide power to the automatic expansion mechanism. Thus it is contemplated that the disclosed case can be configured to have an automatic expansion mechanism, one or more accelerometer, an orientation sensor, and a processing circuit or sensing circuit to determine whether a potentially damaging motion has occurred. Once a potentially damaging motion is determined, the case may activate the automatic expansion mechanism to extend the impact sections outwardly. One advantage of including one or more sensors on the case is that the case can independently determine whether a potentially damaging motion has occurred without relying on the information conveyed from the mobile device. It is also contemplated that software (e.g., an application) can be loaded on the mobile device that uses the sensors on the mobile device alone or in combination with sensors on the case to determine motion, orientation, and/or position that will allow exterior physical deformation or reconfiguration of the case. It is also contemplated that an oil resistant (lipophobic/oleophobic) coating and/or hydrophobic (water repelling) coatings may also be applied to one or more components of the case on the inner and/or outer surfaces. Such coatings may help guard against unwanted water intrusion and smudging and/or soiling on the device and/or case and include but are not limited to formulations of fluorocarbons available from Aculon, San Diego, Calif. 92121; and others. Although not depicted, it should be understood that the cases described herein may also include a plastic or glass (transparent) window panel that overlays the screen of the mobile device and is integrated or fixed into relative position by the other components of the frame (e.g., the front edge 11 or lip portion). The transparent panel may be configured or dimensioned so that it does not extends to the outer circumference of the perimeter of the side support walls to allow for desired flexibility or shock absorption by the compressible stop member 24. The lipophobic/oleophobic coating could also be applied to this window panel on the outer and/or inner surface with or without a hydrophobic coating applied to this window panel on the outer surface.

Although these inventions have been disclosed in the context of certain preferred embodiments and examples, it will be understood by those skilled in the art that the present inventions extend beyond the specifically disclosed embodiments to other alternative embodiments and/or uses of the inventions and obvious modifications and equivalents thereof. In addition, while several variations of the inventions have been shown and described in detail, other modifications, which are within the scope of these inventions, will be readily apparent to those of skill in the art based upon this disclosure. It is also contemplated that various combinations or sub-combinations of the specific features and aspects of the embodiments can be made and still fall within the scope of the inventions. It should be understood that various features and aspects of the disclosed embodiments can be combined with or substituted for one another in order to form varying modes of the disclosed inventions. Thus, it is intended that the scope of at least some of the present inventions herein disclosed should not be limited by the particular disclosed embodiments described above.

What is claimed is:

1. A protective case configured to removably receive and retain a mobile device having a front face and an opposing back face, a left side and an opposing right side, and a top side and an opposing bottom side, said protective case comprising:
    a frame having a back panel configured to reside underneath the back face of the mobile device, the back panel being disposed with a channel;
    a stop component disposed on the back panel; and
    one or more impact sections disposed around the stop component, the impact sections being located alongside the back panel and slidably connected to the channel, wherein each of the impact sections, when subject to sufficient force, is configured to slide alongside the back panel along the channel, to which it is slidably connected, from a first position to a second position thereby communicating at least a portion of the force to the stop component.

2. The protective case of claim 1, wherein said one or more impact sections comprise two impact sections.

3. The protective case of claim 2, wherein said one or more impact sections are rotatable about an axis that is normal to a plane defined by the outer surface of said back panel.

4. The protective case of claim 3, wherein said one or more impact sections, when slidably connected to at least one of the channels, are rotatable about said axis at an angle between 5 degrees and about 45 degrees.

5. The protective case of claim 1, wherein said one or more impact sections comprise a plastic material having an impact strength of at least 7.0 ft lbs/in.

6. The protective case of claim 1, wherein at least one of said one or more impact sections includes a wall portion that, when connected to said frame of said case, is adjacent to at least a region of said outer surface of said side portions and is spaced apart a defined distance from said region of said outer surface.

7. The protective case of claim 6, wherein said defined distance is at least 1.0 mm.

8. The protective case of claim 1, wherein said one or more impact sections is in direct contact with said stop component when in said first and second positions.

9. The protective case of claim 1, wherein said stop component comprises a material and is configured such that said stop component returns to substantially its original shape after being subject to a force resulting from an impact section sliding from said first position to said second position.

10. The protective case of claim 1, wherein said stop component comprises a material and is configured such that said stop component is capable of returning substantially to its original shape when subject to a force imparted by a rotational movement of said one or more impact sections.

11. The protective case of claim 1, wherein said one or more impact sections, when slidably connected to the channel, are also rotatable about an axis that is normal to a plane defined by the outer surface of said back panel.

12. A case for a mobile device comprising:
    a back panel having an inner and outer surfaces defined by a perimeter and comprising a first interface surface;
    a stop component disposed on the back panel; and
    an impact section slidably coupled to the back panel and dimensioned to extend beyond a region of the perimeter of the back panel, wherein the impact section comprising a second interface surface, when subject to sufficient force, configured to slide alongside the first interface surface, from a first position to a second position thereby communicating at least a portion of the force to the stop component, wherein the first and second interface surfaces are adjacent to one another.

13. The case of claim 12, wherein the impact section is slidably coupled within a channel formed on the outer surface of the back panel.

14. The case of claim 12, wherein at least a portion of the second interface surface of the impact section is in continuous contact with the first interface surface when sliding from a first position to a second position.

15. The case of claim 12, further comprising a second impact section that is a separate piece from the first impact section.

16. An assembly for a mobile device protective case comprising:
- a frame having a first end and a second end opposing to the first end;
- a stop component disposed on a back panel of the frame;
- a first impact piece slidably coupled to the frame through a first interface from the first end; and
- a second impact piece slidably coupled to the frame through a second interface from the second end, wherein each of the first and second interfaces is adapted to guide sliding movement of the slidably coupled impact piece under force from a first position to a second position relative to the frame thereby communicating at least a portion of the force to the stop component.

17. The assembly of claim 16, wherein at least one of the first and second impact pieces is configured to be user separable from the frame.

\* \* \* \* \*